March 2, 1965 R. L. DAVIES 3,172,068

SEMICONDUCTOR DEVICE

Filed April 5, 1961

INVENTOR:
ROBERT L. DAVIES,

BY Julius J. Zaskalicky
HIS ATTORNEY

United States Patent Office 3,172,068
Patented Mar. 2, 1965

3,172,068
SEMICONDUCTOR DEVICE
Robert L. Davies, Auburn, N.Y., assignor to General Electric Company, a corporation of New York
Filed Apr. 5, 1961, Ser. No. 100,982
7 Claims. (Cl. 338—13)

This invention relates to semiconductor devices and, in particular, to asymmetrically conductive devices of the junction type having large current carrying capabilities.

One form of such asymmetrically conductive device is a high current rectifier. The active elements, referred to as the rectifying sandwich, of one such rectifier device consists of a wafer of N-type conductivity silicon semiconductor material with a layer of aluminum and a backing plate usually of molybdenum or tungsten on one side, and with a layer of antimony-doped gold and a similar backing plate on the other side thereof. Each of these backing plates are of the same thickness and substantially thicker than the wafer. The entire sandwich is heated for a time and temperature to cause the aluminum and gold-antimony to fuse the entire sandwich together. The backing plates have relatively good thermal and electrical conductivity, and have a coefficient of expansion close to the coefficient of expansion of the semiconductor material. Thus the backing plates not only provide a low resistance electrical contact to the wafer and remove heat therefrom, but also protect the fragile semiconductor wafer from fracture. One of the backing plates is then securely joined to a suitable mounting of substantial extent which in turn forms one of the external electrical terminals of the rectifier and at the same time provides means for removal of heat developed in the silicon semiconductor material. Suitable connection is made to the other backing plate to form the other external terminal of the rectifier.

Copper is a common material for such a mounting because it has excellent heat and electrical conductivity properties. The backing plate is joined to the mounting with a suitable thermal fatigue-free solder, for example, a solder which retains its strength and does not fail on thermal cycling over a long period of time. These solders or brazing materials are usually referred to as hard solders. One such solder is disclosed in a copending application, Serial Number 857,593, filed December 7, 1959 in the name of Joseph K. Flowers and William F. Lootens and assigned to the assignee of the present invention. When such an assembled structure is cooled and, in particular, when it is cooled and operated at a low temperature, the differential expansion between mounting and the backing plate secured thereto sets up stresses in the assembled structure which are transmitted to the semiconductor wafer, producing strains therein and causing a fracture thereof.

The present invention is directed to the provision of mounting structures for semiconductor devices which avoid such disadvantages of the prior art.

An object of the present invention is to provide an improved asymmetrically conductive device of simple and inexpensive design which will withstand greater thermally-induced stresses than heretofore possible.

Another object of the present invention is to provide large area rectifying devices having low forward voltage drop and free of fatigue failure over wide temperature ranges.

A further object of the present invention is to extend the current ranges of rectifier devices at minimum cost without sacrificing performance.

In carrying out this invention in one form as applied to a semiconductor device, there is provided a wafer of silicon semiconductor material, each side of which is bonded to a respective one of a pair of metal supporting plates. A base mounting semiconductive member of substantial extent is also provided bonded to the other surface of one of said plates. The thermal coefficient of expansion of the plate is comparable to that of the semiconductor material. The plate remote from the mounting member is of minimal thickness to provide good electrical characteristics, the plate secured to the mounting member being substantially thicker than the other only to the extent of avoidance of fracture at the outer temperature limits of the operation thereof.

These and other advantages of this invention will be more clearly understood from the following description taken in connection with the accompanying drawings and its scope will be apparent from the appended claims.

Figure 1:
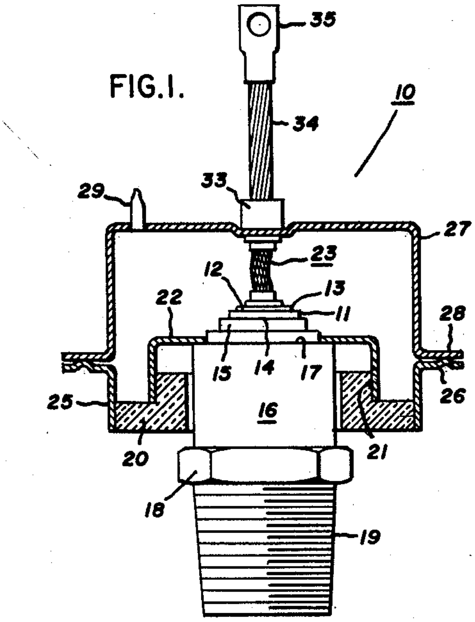
FIGURE 1 is an elevational view in section of a high current semiconductor rectifier constructed in accordance with the present invention.
Figure 2:
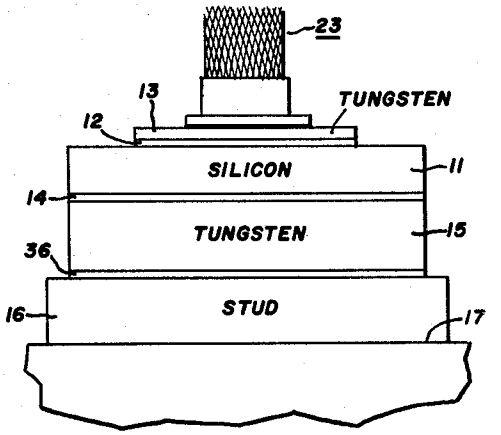
FIGURE 2 is an elevational view in section of the active rectifying elements of the rectifier.

Referring now to FIGURES 1 and 2, a semiconductor junction-type rectifier is shown mounted in a sealed, self-contained unit which is referred to generally by the reference character 10. In this embodiment the active elements of the rectifier referred to as the rectifying sandwich consists of a monocrystalline wafer or pellet of N-type silicon semiconductor material 11 with a layer of aluminum 12 and a backing plate 13 of tungsten on one side thereof and with a layer 14 of antimony-doped gold and a similar backing plate 15 on the other side thereof. The entire sandwich is heated for a time and temperature, to be explained in greater detail below, to cause the aluminum and gold to fuse the entire sandwich together. Plates 13 and 15 are preferably made of tungsten or molybdenum or equivalent materials having similar temperature coefficients of expansion as the semiconductor as well as good heat and electrical conduction properties. By providing the plates with similar coefficients of expansion, the silicon pellet is protected from extraneous pressures created by temperature differentials when the device is being fabricated or utilized in an operating circuit as will be more particularly pointed out below. The entire rectifying sandwich, which consists of the aforementioned elements, is mounted on a copper base provided by the stud or block 16 by means of a suitable solder, preferably a hard solder of good high temperature characteristics, for example, a gold-tin solder, such as disclosed in the aforementioned patent application.

Stud 16 is provided with an annular shelf 17 on the upper extremity thereof, the hexagonal nut 18 in the central portion thereof and a tapered thread 19 on the lower portion thereof. The stud 16 is mounted to a ring 25 of steel or other suitable material which forms a portion of the casing for unit 10 through the combination of an annular ceramic insulator 20 and an annular clip 22. The clip is adapted to be received on the shelf 17 of stud 16 and upon the annular shelf 21 of ceramic member 20. Clip 22 has a temperature coefficient of expansion similar to that of the ceramic 20 and may be made of cold rolled steel or a variety of iron, nickel and cobalt alloys, having a coefficient of expansion comparable to that of ceramic materials such as fernico. Ceramic 20 may be secured to steel ring 25 and to clip 22 by silver brazing to a metalized surface on the ceramic applied by the process of moly-manganese metalizing on the ceramic which is well known in the art and is shown and described, for example, in Patent 2,667,432—

U.S. patent of Nolte, which is assigned to the assignee of this invention.

A cup-shaped casing member 27, of steel or other suitable material, which has flanged end portions 28 thereon, is sealed to the flanged end portions 26 of ring 25. A collar 33 is mounted on cup 27 and receives a flexible cable 34 having a terminal 35. Another flexible cable 23 is provided having one end conductively secured to plate 13 and the other end secured to member 27. Member 27 is also provided with an exhaust tube 29 which may be used to test for leaks in the sealed unit or may be used to control the ambient conditions in the sealed area. When this has been accomplished, the tube is pinched off and sealed.

Referring now particularly to FIGURE 2, there is shown an elevation view in section of the rectifying sandwich with portions of the external connections. In connection with these figures, the materials making up the rectifying sandwich and its manner of connection to external leads will be described. The silicon semiconductor wafer 11 is of N-type conductivity with a resistance of about twenty ohm-centimeters. The wafer has a diameter of approximately .375 inch and a thickness of approximately seven mils (thousandths of an inch). On one side of the wafer is positioned an aluminum disc 12 approximately .312 inch in diameter and three mils thick. Above the aluminum disc is situated a plate of tungsten 13 which has been suitably cleaned. The tungsten plate has a diameter of approximately .312 inch and a thickness of approximately .05 inch. The side of the tungsten plate adjacent the aluminum is clean and the other side is coated with silver. On the other side of the wafer is positioned a disc 14 of gold-antimony, approximately ninety-nine percent gold and one percent antimony, having a diameter of .375 inch and a thickness of .003 inch. Below the gold antimony disc is situated another tungsten plate 15 similar to tungsten plate 13, having a diameter of .375 inch and a thickness of .030 inch. The side of the tungsten plate adjacent the gold-antimony disc is clean and the other side is coated with silver.

In the fabrication of the elements described, they are stacked together as indicated and passed through a tunnel oven, the peak temperature of which is approximately 750° C. It takes about fifty minutes for the sandwich to be elevated from room temperature 25° C. to the peak temperature. The sandwich is held at peak temperature for about three minutes and then allowed to cool to room temperature in about two hours. In this operation the aluminum is fused to the silicon to form a P-N junction therein and at the same time the silicon is fused to the tungsten backing plate. Similarly, the gold-antimony disc fuses the tungsten backing plate to the N-type silicon wafer to form a good ohmic contact therewith.

The sandwich is next secured to lower and upper external terminals. As antimony-gold-silicon alloy formed at the lower surface of the wafer melts at 366° C., subsequent operations on the sandwich involving heating preferably must not exceed or even get close to this temperature if damage to the sandwich is to be avoided. When the gold-antimony solder is used to form a P-N junction in a body of silicon semiconductor material, of course, this temperature should not be exceeded or even approached; however, when the gold-antimony solder is used for making a nonrectifying connection to the semiconductor material, this temperature may be exceeded up to any other critical temperature in the sandwich, such as the temperature of formation of the aluminum alloy junction described above.

The tungsten plate is secured to the stud 16, which preferably is of copper, by means of a layer 36 of hard solders of the kind described in the above-referenced application. Tungsten plate 13 may similarly be secured to conductor 23. Thereafter, the sandwich and supporting structure is housed and completed in the manner described above. Of course, if desired, the elements of the sandwich may be etched and treated by techniques well known in the art prior to complete assembly of the rectifier.

In prior art structures, difficulty has been encountered with rectifiers in which the backing plates were of the same thickness, for example, 20-mil thick tungsten plates secured to the copper mounting member 16 with the fatigue-free hard solders of the kind described above. Fractures in the silicon pellet were experienced when such rectifiers were lowered to temperatures below room temperature yet considerably above a desired limit of −65° C. In accordance with the present invention, such problems were avoided by a proper proportioning of the thicknesses of the upper tungsten backing plate and lower tungsten plates. The upper plate was made thin, yet not so thin as to effect appreciably the electrical conductivity thereof to currents flowing through the rectifier. The lower plate was made substantially thicker than the upper plate. The minimal value of the thickness is determined by stress the semiconductor wafer is able to withstand at the extremes of temperature for which the rectifier is designed. While utilization of lower plates of thickness beyond this value would be satisfactory, they would increase the electrical and thermal resistance of the rectifier as well as its cost needlessly. The manner of determination of the thickness of the lower plate will be explained in connection with the graph of FIGURE 3.

Figure 3:
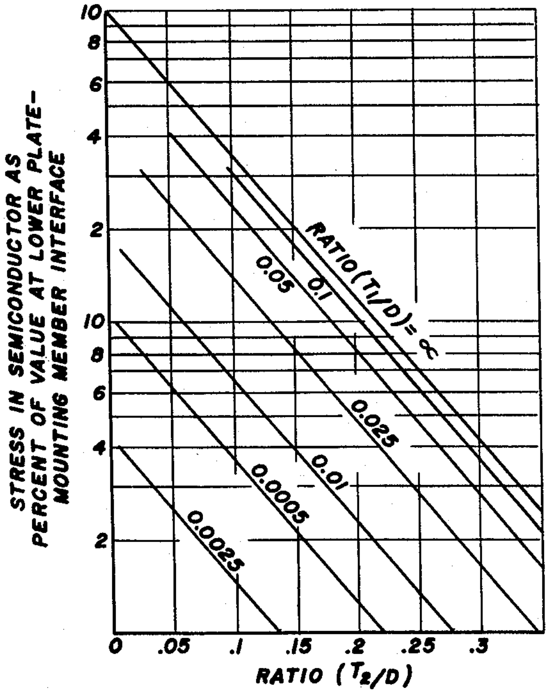
FIGURE 3 is a composite graph showing shear stress in the semiconductor element of a rectifier in terms of percent of the value existing at the mounting member-backing plate interface as a function of thickness to diameter ratios of the backing plates.

FIGURE 3 shows a composite graph of the percent of stress existing at the semiconductor wafer as a percent of the value existing at the lower tungsten plate-mounting member interface as a function of the ratios of the thickness to diameter of the lower plate and the thickness to the diameter of the upper plate. T1 is the bottom plate thickness, T2 is the top disk thickness and D is the diameter of these plates. While the graphs are based on the diameter of the plates being the same, it will be appreciated that when the upper plate is of smaller diameter, the stress values are more conservative than shown. For a rectifier having an upper plate with a diameter of the order of 0.500 inch, a thickness of five mils has been found sufficiently thick so as not to appreciably affect the electrical characteristics thereof. Empirically, it has been determined that values of stress less than ten percent of the interface value are adequate to avoid fracture of the semiconductor wafer at such extreme ambient temperatures as −65° C. Accordingly, from the abscissa of the intersection of the $$\frac{T1}{D}$$

line of value .01 and the stress ordinate of ten percent, a value .06 is obtained for the ratio of $$\frac{T2}{D}$$

As the diameter of the lower plate D=.500 inch, the thickness of the plate should be .030 inch to hold stress to a value less than ten percent. For both plates of the same thickness, namely .030 inch, the value of stress would be about forty percent of the interface value. Thus, by proportioning of the plates as disclosed in the present application, considerable reduction in stress is obtained and at the same time an improvement in the performance of the rectifier and a reduction of its cost is obtained.

Of course, if larger diameter semiconductor wafers are used, then proportionate changes should be made in the thickness of the tungsten plates as well as in the diameter thereof in accordance with the above disclosures. For larger diameter wafers, larger diameter lower plates would be used with corresponding larger thicknesses. In accordance with the present invention, larger current-carrying rectifiers using such large wafers need not have prohibitively large thickness plates with resultant poorer performance and excessive cost. While ratios of lower plate thickness to upper plate thickness for current rectifiers of the 25–50 ampere rating may be of the order of 5, such ratios for rectifiers of substantially higher current-carrying capacity may be of the same order or higher.

It will be understood that other semiconductor materials as well as other backing plate materials and mounting members may be used and the geometrical proportions thereof may be varied over a wide range without departing from the true spirit and scope of the invention. Accordingly, while specific embodiments have been shown and described, it will, of course, be understood that various modifications may be devised by those skilled in the art which will embody the principles of the invention as found in the true spirit and scope thereof.

What I claim as new and desire to secure by Letters Patent of the United States is:

1. In combination, in a semiconductor device, a wafer of semiconductor material, a pair of metal supporting plates, a surface on one of each of said plates bonded to a respective side of said wafer, a base mounting conductive member of substantial extent, the other surface of one of said plates securely joined to a surface of said member, said base mounting conductive member being dissimilar in composition to the composition of said one plate, said one plate being substantially thicker than the other of said plates and of sufficient thickness such that over wide temperature ranges differential expansion stress set up at the interface of said mounting member and said one plate are short of producing sufficient stress in said wafer to cause fracture thereof.

2. In combination, in a semiconductor device, a wafer of semiconductor material, a pair of metal supporting plates, a surface of one of each of said plates bonded to a respective side of said wafer, a base mounting conductive member of substantial extent, the other surface of one of said plates securely joined to a surface of said member, said base mounting conductive member being dissimilar in composition to the composition of said one plate, the areas of each of said plates being substantially equal to the area of said wafer and said one plate being substantially thicker than the other of said plates and of sufficient thickness such that over wide temperature ranges differential expansion stress set up at the interface of said mounting member and said one plate are short of producing sufficient stress in said wafer to cause fracture thereof.

3. In combination, in a semiconductor device, a wafer of semiconductor material, a pair of metal supporting plates, a surface of one of each of said plates bonded to a respective side of said wafer, a base mounting conductive member of substantial extent, the other surface of one of said plates securely joined to a surface of said member, said base mounting conductive member being dissimilar in composition to the composition of said one plate, the areas of each of said plates being substantially equal to the area of said wafer, and said one plate being substantially thicker than either the other of said plates or said wafer and of sufficient thickness such that over wide temperature ranges differential expansion stress set up at the interface of said mounting member and said one plate are short of producing sufficient stress in said wafer to cause fracture thereof.

4. In combination, in a semiconductor device, a wafer of semiconductor material, a pair of metal supporting plates, a surface of one of each of said plates bonded to a respective side of said wafer, a base mounting conductive member of substantial extent, the other surface of one of said plates securely joined to a surface of said member, said base mounting conductive member being dissimilar in composition to the composition of said one plate, said one plate being substantially thicker than the other of said plates, the surface area of said wafer being less than the surface area of said one plate and the surface area of said other plate being less than the surface area of said wafer and of sufficient thickness such that over wide temperature ranges differential expansion stress set up at the interface of said mounting member and said one plate are short of producing sufficient stress in said wafer to cause fracture thereof.

5. In combination in a semiconductor device, a wafer of semiconductor material, a pair of metal supporting plates, the temperature coefficient of expansion of said plates being comparable to the temperature coefficient of expansion of said material, a surface of one of each of said plates bonded to a respective side of said wafer, a base mounting conductive member of substantial extent, the other surface of one of said plates securely joined to a surface of said member, said base mounting conductive member being dissimilar in composition to the composition of said one plate, said one plate being substantially thicker than the other of said plates and of sufficient thickness such that over wide temperature ranges differential expansion stress set up at the interface of said mounting member and said one plate are short of producing sufficient stress in said wafer to cause fracture thereof.

6. In combination, in a semiconductor device, a brittle wafer of semiconductor material selected from the group consisting of silicon and germanium and having at least one rectifying junction therein, a pair of metal supporting plates having good thermal and electrical conductivity and a coefficient of expansion comparable to the coefficient of expansion of said semiconductor material, a surface of each of said plates bonded to a respective side of said wafer, a mounting member of copper of substantial extent, the other surface of one of said plates securely joined to a surface of said member, said other plate being of sufficient thickness to provide good electrical conductive path for current flow through said wafer, and said one plate being substantially thicker than said other plate and of sufficient thickness such that over wide temperature ranges differential expansion stress set up at the interface of said mounting member and said one plate are short of producing sufficient stress in said wafer to cause fracture thereof.

7. A semiconductor device including, a wafer of semiconductor material, a pair of metal supporting plates, a surface on one of each of said plates bonded to a respective side of said wafer, a base mounting conductive member composed of a material which is dissimilar to the composition of said metal supporting plates, the other surface of one of said plates securely joined to a surface of said conductive member, said one plate being substantially thicker than the other of said plates and the relative thicknesses of said plates being proportioned in such a manner that stress in said semiconductor material is less than 10% of the value at the interface between said one plate and said conductive member.

References Cited by the Examiner

UNITED STATES PATENTS

| | | | |
|---|---|---|---|
| 2,405,192 | 8/46 | Davis | 338—22 |
| 2,847,544 | 8/56 | Taft et al. | 338—28 |
| 2,966,646 | 12/60 | Baasch | 338—22 |
| 2,978,661 | 4/61 | Miller et al. | 338—22 |

RICHARD M. WOOD, *Primary Examiner.*

ROBERT K. WINDHAM, *Examiner.*